United States Patent
Miyake et al.

(10) Patent No.: US 7,081,774 B2
(45) Date of Patent: Jul. 25, 2006

(54) CIRCUIT HAVING SOURCE FOLLOWER AND SEMICONDUCTOR DEVICE HAVING THE CIRCUIT

(75) Inventors: Hiroyuki Miyake, Atsugi (JP); Yutaka Shionoiri, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 29 days.

(21) Appl. No.: 10/893,936

(22) Filed: Jul. 20, 2004

(65) Prior Publication Data

US 2005/0041021 A1    Feb. 24, 2005

(30) Foreign Application Priority Data

Jul. 30, 2003    (JP) ............................. 2003-282267

(51) Int. Cl.
*H03K 19/0175* (2006.01)
*H03K 19/094* (2006.01)
*H03K 19/082* (2006.01)
*G11C 11/14* (2006.01)
*G11C 11/44* (2006.01)

(52) U.S. Cl. ............................ 326/83; 326/82; 326/86; 326/89; 326/90; 365/161

(58) Field of Classification Search ............ 326/82–83, 326/86, 89–90; 365/161
See application file for complete search history.

(56) References Cited

U.S. PATENT DOCUMENTS

| | | | |
|---|---|---|---|
| 6,057,183 A * | 5/2000 | Koyama et al. ............ 438/166 |
| 6,313,819 B1 * | 11/2001 | Maekawa et al. ............. 345/92 |
| 6,320,422 B1 * | 11/2001 | Koh ............................ 326/115 |
| 6,686,772 B1 * | 2/2004 | Li et al. ....................... 326/83 |
| 6,693,463 B1 * | 2/2004 | Mateman ..................... 326/127 |
| 6,731,273 B1 * | 5/2004 | Koyama et al. ............ 345/204 |
| 2003/0020969 A1 | 1/2003 | Kimura |
| 2003/0132930 A1 | 7/2003 | Kimura et al. |
| 2003/0142520 A1 | 7/2003 | Kimura et al. |
| 2003/0174009 A1 | 9/2003 | Kimura et al. |
| 2003/0230750 A1 | 12/2003 | Koyama et al. |

FOREIGN PATENT DOCUMENTS

| EP | 0 899 714 | 3/1999 |
|---|---|---|
| JP | 11-073165 | 3/1999 |
| JP | 2000-194327 | 7/2000 |

* cited by examiner

*Primary Examiner*—Rexford Barnie
*Assistant Examiner*—Jason Crawford
(74) *Attorney, Agent, or Firm*—Eric J. Robinson; Robinson Intellectual Property Law Office P.C.

(57) ABSTRACT

When a potential of a power supply line varies according to a flowing current, the gate-source voltage Vgs of a transistor also varies, leading to variations in the constant current between each source follower. In order to solve this problem, a potential Vb of the gate terminal of a transistor as a constant current source is changed in the same manner as a power supply line Vss which is connected to the source terminal of the transistor. Therefore, variations in the constant current are suppressed and variations in the output of the source followers are thus suppressed. In addition, by connecting the circuit having source followers to the output side of a signal line driver circuit, it can be prevented that luminance unevenness of a striped pattern is recognized in a display portion of a semiconductor device.

36 Claims, 7 Drawing Sheets

CIRCUIT HAVING SOURCE FOLLOWER AND SEMICONDUCTOR DEVICE HAVING THE CIRCUIT

BACKGROUND OF THE INVENTION

1. Field of the Invention

The present invention relates to a source follower, and more particularly to a semiconductor device having amplifiers such as source followers formed by using thin film transistors in a driver circuit.

It should be noted that a semiconductor device in this specification refers to all the devices which function by the use of semiconductor characteristics. For example, an electro-optical apparatus, a semiconductor circuit, and an electronic apparatus all fall in the category of the semiconductor device.

2. Description of the Related Art

FIG. 7 is a circuit diagram of a general source follower. In the source follower shown in FIG. 7, an input potential Vin is supplied to the gate (G) of a transistor 901 while a potential Vdd (Vdd>Gnd (ground potential)) is supplied to the drain (D) thereof. In addition, the source (S) of the transistor 901 is connected to a constant current source 902 and a potential of the source is equal to an output potential Vout.

The output potential Vout of the source follower having the above configuration is expressed by the following Formula 1. It should be noted that Vgs corresponds to a voltage (gate-source voltage) obtained by subtracting a source potential from a gate potential.

$$Vout = Vin - Vgs \quad \text{[Formula 1]}$$

A value of the gate-source voltage Vgs is determined by the relationship among the input potential Vin, the potential Vdd, and a drain current Id. When the transistor 901 operates in a saturation region, the drain current Id is expressed by the following Formula 2. It should be noted that i denotes mobility, $C_o$ denotes a gate capacitance per unit area, W/L denotes a ratio of the channel width (W) to the channel length (L) in a channel forming region and Vth denotes a threshold voltage.

$$Id = i C_o W/L (Vgs - Vth)^2 / 2 \quad \text{[Formula 2]}$$

In Formula 2, each of the i, $C_o$, W/L and Vth is a value determined by an individual transistor. The drain current Id of the transistor 901 is almost determined by the constant current source 902. Consequently, Formula 2 shows that when the threshold voltage Vth is at a constant value, a predetermined value of the gate-source voltage Vgs can be obtained. Conversely, when the threshold voltage Vth varies, the gate-source voltage Vgs also varies correspondingly, leading to variations in the output potential Vout.

As a conventional method for adjusting the output of source followers, there is the one providing an output correction circuit (see Japanese Patent Laid-Open No. Hei 11-073165).

Assumed now is a circuit having source followers. Generally, a source follower is required to have a circuit for generating a constant current. Therefore, in the simplest case, it is constructed by using one transistor whose source terminal is connected to a power supply line, and operating the transistor in a saturation region by supplying a constant potential to the gate terminal thereof. The constant current Id at this time can be expressed by the above Formula 2.

When a potential of the power supply line varies according to a flowing current, the gate-source voltage Vgs of the transistor also varies, leading to variations in the constant current between each source follower. As a result, the output of the source followers varies even with the same input potential as described above.

As a means to solve the problem, there is a method of constructing a correction circuit as disclosed in Japanese Patent Laid-Open No. Hei 11-073165. However, several signals are required additionally in this case. In addition, this method cannot be employed in the circuit which can hardly secure enough time for correction. Alternatively, a method of using a power supply line which is thick enough to maintain a potential of the power supply line constant, or a method of lowering a resistance of a wiring by thickening a film of the wiring can also be employed. However, these methods are disadvantageous in that the circuit scale becomes quite large.

SUMMARY OF THE INVENTION

According to the invention, a potential Vb of the gate terminal of a transistor as a constant current source is changed in the same manner as a power supply line which is connected to the source terminal thereof. Therefore, variations in the constant current are suppressed and variations in the output of the source followers are thus suppressed.

A circuit of the invention includes n-pairs of source followers each including a first transistor and a second transistor connected to the source electrode of the first transistor, a first power supply line electrically connected to the gate electrode of the second transistor in each of the n-pairs of source followers, a second power supply line electrically connected to the source electrode of the second transistor in each of the n-pairs of the source followers, a third power supply line, and a constant current source disposed between the first power supply line and the third power supply line and electrically connected to the first power supply line and the third power supply line, wherein an output potential of each of the n-pairs of source followers is corrected by correcting a potential of the first power supply line by the constant current source and the third power supply line.

A circuit of the invention includes n-pairs of source followers each including a first transistor and a second transistor connected to the source electrode of the first transistor, a first power supply line electrically connected to the gate electrode of the second transistor in each of the n-pairs of source followers, a second power supply line electrically connected to the source electrode of the second transistor in each of the n-pairs of the source followers, a third power supply line, and a resistor disposed between the first power supply line and the third power supply line and electrically connected to the first power supply line and the third power supply line, wherein an output potential of the each of the n-pairs of source followers is corrected by correcting a potential of the first power supply line by the resistor and the third power supply line.

It should be noted that each of the first transistor and the second transistor may be a thin film transistor.

Each of the first transistor and the second transistor may have the same conductivity.

In addition, the number of the constant current sources disposed between the first power supply line and the third power supply line may be equal to that of the source followers.

A semiconductor device using the circuit of the invention includes a liquid crystal display device, a light emitting device which has a light emitting element represented by an organic light emitting element in each pixel, and other semiconductor devices which have circuit elements formed by using semiconductor films in their driver circuits. The semiconductor device of the invention is not limited to the above semiconductor devices. It includes a semiconductor integrated circuit using the circuit having source followers of the invention.

According to the invention, a transistor other than a thin film transistor may be used. A transistor used in the invention may be a transistor formed by using single crystalline silicon or an SOI, a thin film transistor using polycrystalline silicon or amorphous silicon, or a transistor using an organic semiconductor or a carbon nanotube. In addition, a transistor disposed in a pixel of the light emitting device of the invention may be a single-gate transistor, a double-gate transistor, or a multi-gate transistor having more than two gate electrodes.

According to the above configuration of the invention, an output potential of the source follower is prevented from varying due to an influence of a change in potential of the power supply line connected to the source follower. This method is quite simple since it requires no additional signal lines unlike the case of using a correction circuit. In addition, since time for correction is not required unlike the case of using a correction circuit, the invention can be applied to such a circuit as to output signals constantly.

DETAILED DESCRIPTION OF THE INVENTION

Embodiment modes of the invention will be hereinafter described with reference to the accompanying drawings.

EMBODIMENT MODE 1

Figure 1:
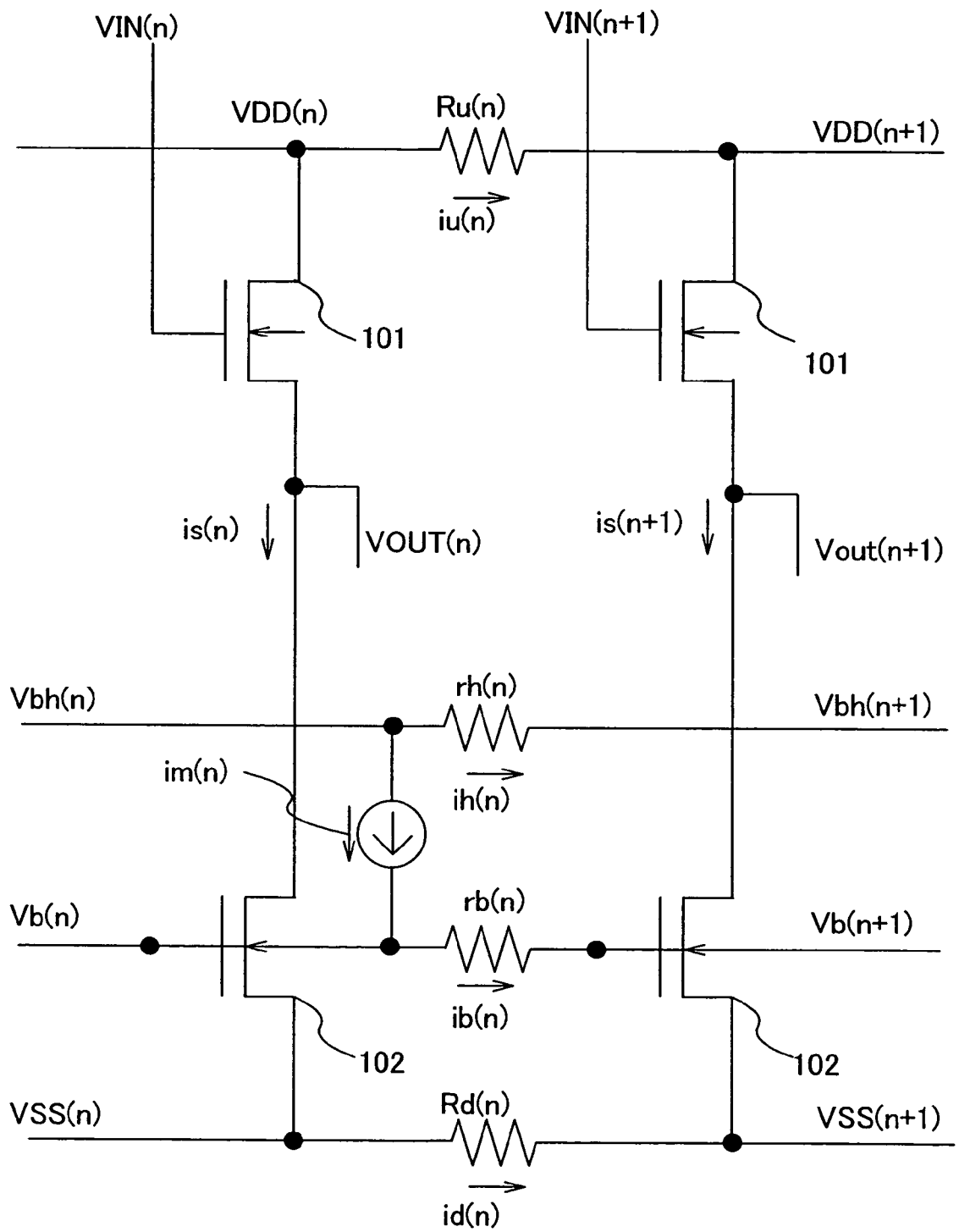
FIG. 1 is a diagram of the circuit having source followers of the invention.

FIG. 1 is a circuit diagram as one mode of the circuit having source followers of the invention.

A power supply line Vbh is provided and an appropriate constant current source is disposed between power supply lines Vbh and Vb. The constant current source may be a resistor. By efficiently setting a current value flowing in the constant current source, the potential change of the power supply line Vb is adjusted to be equal to the potential change of the power supply line VSS.

FIG. 1 includes two source followers each including N-channel transistors 101 and 102.

As shown in FIG. 1, a current flowing in an n-th source follower is denoted by is(n), a potential of the high potential power supply line is denoted by VDD(n), a potential of the low potential power supply line is denoted by VSS(n), a potential of the power supply line for specifying a value of the constant current is denoted by Vb(n) and a potential of a power supply line which is additionally provided according to the invention is denoted by Vbh(n). In addition, a resistor between an n-th source follower and an (n+1)-th source follower is denoted by Ru(n), a resistor in the VSS is denoted by Rd(n), a resistor in the Vb is denoted by rb(n), a resistor in the Vbh is denoted by rh(n) and a current flowing in the constant current source disposed between the Vb(n) and the Vbh(n) is denoted by im(n). Furthermore, a current flowing in the Ru(n) is denoted by iu(n), a current flowing in the Rd(n) is denoted by id(n), a current flowing in the rb(n) is denoted by ib(n) and a current flowing in the rh(n) is denoted by ih(n).

At this time, a current flowing in the n-th source follower is determined by the gate-source voltage Vgs(n) of a transistor whose gate terminal receives Vb(n), and expressed by the following Formula 3.

$$Vgs(n)=Vb(n)-VSS \qquad \text{[Formula 3]}$$

At this time, Vgs(n+1)=Vb(n+1)−VSS(n+1) is satisfied. The Vgs(n+1) can be developed into the following Formula 4 using the Kirchhoff's law.

$$Vgs(n+1)=Vgs(n)+Rd(n)\times id(n)-rb(n)\times ib \qquad \text{[Formula 4]}$$

In order that Vgs(n+1)=Vgs(n), the following Formula 5 has to be satisfied.

$$Rd(n)\times id(n)=rb(n)\times ib(n) \qquad \text{[Formula 5]}$$

When each value of the rb(n) and ib(n) is determined so as to satisfy the Formula 5, the Vgs is maintained constant in all the source followers.

According to the above configuration of the invention, an output potential of the source follower Vout is prevented from varying due to an influence of a potential change of the power supply line Vb connected to the source follower.

In addition, by connecting the circuit having source followers on the output side of a signal line driver circuit, it can be prevented that luminance unevenness is recognized in a display portion of a semiconductor device.

It should be noted that although FIG. 1 employs source followers using N-channel transistors, the invention can be applied to source followers using P-channel transistors as well.

The semiconductor device using the circuit of the invention includes a liquid crystal display device, a light emitting device which has a light emitting element represented by an organic light emitting element in each pixel, a DMD (Digital Micromirror Device), a PDP (Plasma Display Panel), an FED (Field Emission Display) and the like, and other semiconductor devices which have circuit elements formed by using semiconductor films in their driver circuits. In addition, the semiconductor device of the invention is not limited to the above semiconductor devices. It includes a semiconductor integrated circuit using the circuit having source followers of the invention as well.

EMBODIMENT MODE 2

Figure 2:
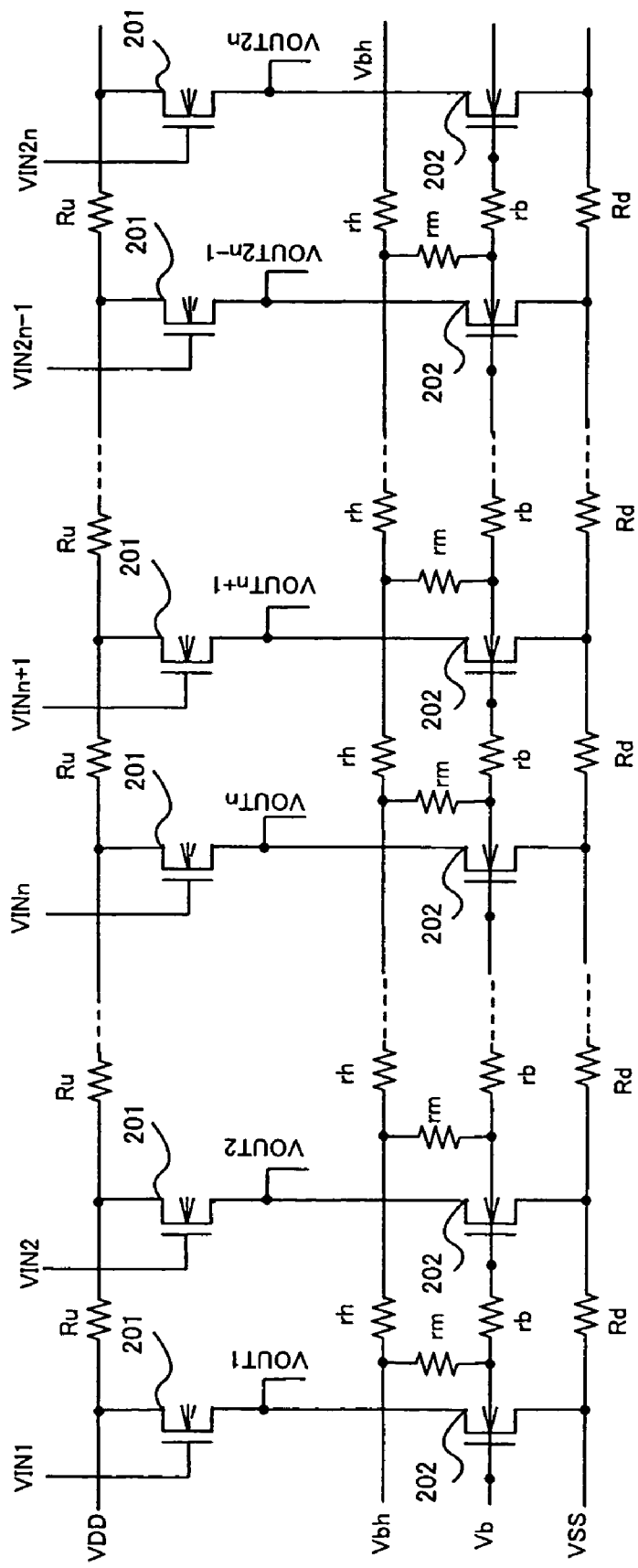
FIG. 2 is a diagram of the circuit having source followers of the invention as an example.

FIG. 2 includes 2n source followers each including N-channel transistors 201 and 202. Power supply lines are connected to each of right and left ends of the source followers.

It is assumed here that all the transistors have the same size, and a power supply line connecting each source follower or the like has the same resistance value among all the source followers.

As shown in FIG. 2, the high potential power supply line is denoted by VDD, the low potential power supply line is denoted by VSS, a power supply line for specifying a value of a constant current is denoted by Vb, a power line newly added for the present invention id denoted by Vbh, a resistor in the VDD between each source follower is denoted by Ru, a resistor in the VSS between each source follower is denoted by Rd, a resistor in the Vb is denoted by rb, a resistor in the Vbh is denoted by rh and a resistor disposed between the Vb and Vbh in each source follower is denoted by rm. Although rm is desirably a constant current source, a resistor is adopted here.

At this time, a current flowing in one source follower is determined by the gate-source voltage Vgs of a transistor 202 whose gate terminal receives a potential of Vb. When this current is referred to as ic, a potential of VDD drops by $n(n-1) \times Ru \times ic/2$ while a potential of VSS is raised by $n(n-1) \times Rd \times ic/2$ in the source follower which is positioned around the middle.

The output of each source follower remains substantially the same if the transistor included in the source follower operates in a saturation region even if the potential of VDD changes. Therefore, changes in the potential of VDD can be disregarded.

Assuming that a potential of the power supply line Vb is constant in all the source followers, Vgs differs between the source follower in the middle and the source follower in each end. That is, even when the input VIN(k) (k=1, 2, . . . and n) is the same among all the source followers for example, the output potential is different in the source follower in the middle and the source follower in right or left end.

Figure 3:
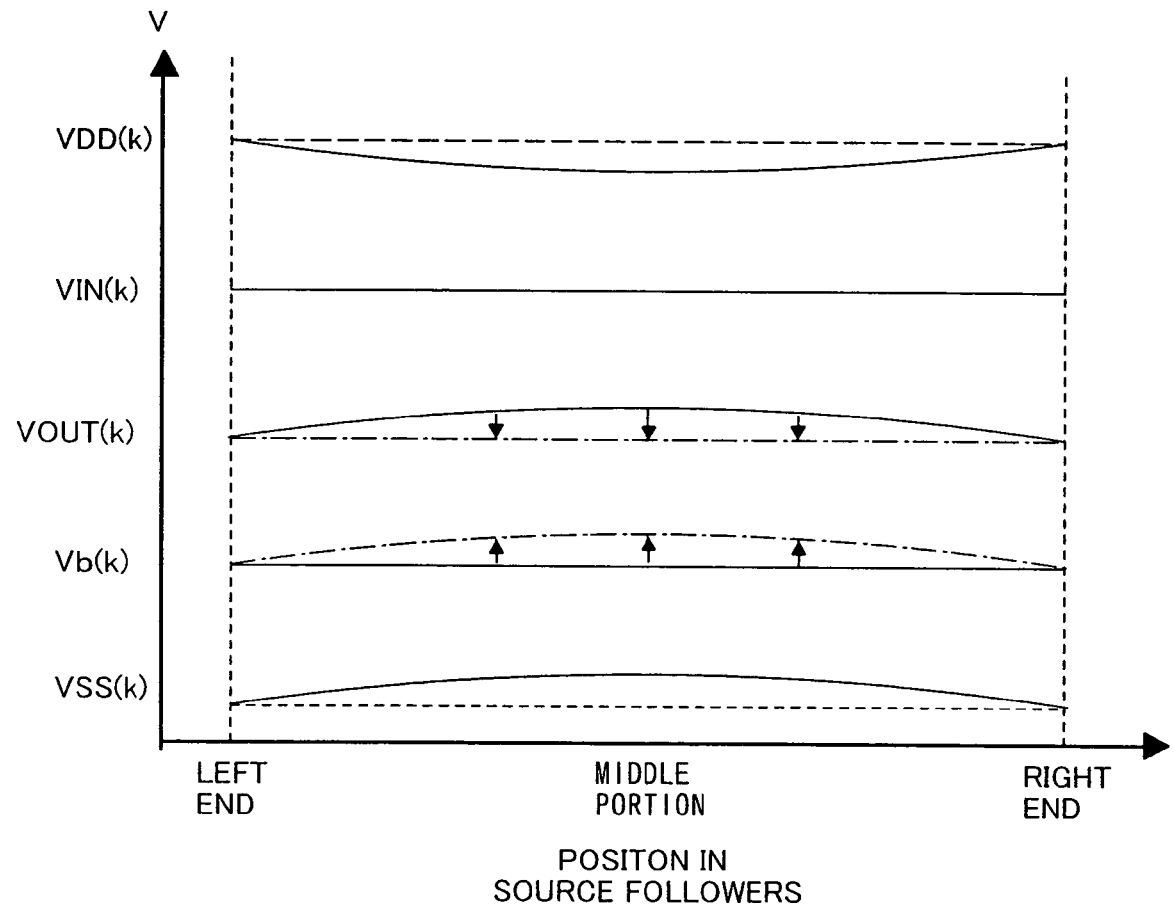
FIG. 3 is a diagram showing potential distribution of each power supply in an example of the circuit having the circuit having source followers.

This is illustrated in FIG. 3. When Vss is raised, the output potential is higher in the source follower in the middle than in each end even when the same input VIN(k) (k=1, 2, . . . and n) is supplied to all the source followers.

A current flowing in the resistor rm in the n-th source follower is assumed to be imn. When disposing the constant current source in stead of the resistor rm, imn can be maintained constant regardless of n. In addition, if the potential difference between Vbh and Vb is set sufficiently larger than the potential change of Vb and Vbh, imn may be regarded as being constant. This constant value is assumed to be im.

At this time, in the source follower positioned around the middle, the potential of Vb is raised by $n(n-1) \times rb \times im/2$ while Vbh drops by $n(n-1) \times rh \times im/2$. If rh is set to have a sufficiently small resistance value, the potential drop of Vbh can be disregarded.

Hereupon, rb and im are controlled so that $rb \times im = Rd \times ic$.

In this case, Vb can have similar potential distribution to that of VSS as shown by dashed lines in FIG. 3, which means Vgs can be constant in all the source followers. Consequently, in the case where the input VIN(k) (k=1, 2, . . . and n) is the same among all the source followers, the output thereof can be constant as well.

It should be noted that although the example in FIG. 2 is the case of connecting the power supply lines to each end of the source followers, it is also possible to adjust the potential change in VSS and Vb to be equal in the circuit having different configurations.

In addition, although the resistance value of the power supply line and the current value flowing in each source follower are the same among the whole source followers in the example in FIG. 2, it is also possible to adjust the potential changes of VSS and Vb to be equal in the circuit having different configurations.

The number of the constant current sources or the resistors for correction is equal to that of the source followers in the example in FIG. 2, however, they may be different. In that case, the potential changes in VSS and Vb can be adjusted to be approximately equal to each other.

It should be noted that although FIG. 2 employs source followers using N-channel transistors, the invention can be applied to source followers using P-channel transistors as well.

Based on the above configuration of the invention, a description is given in more detail in the following embodiment.

EMBODIMENT 1

Figure 4:
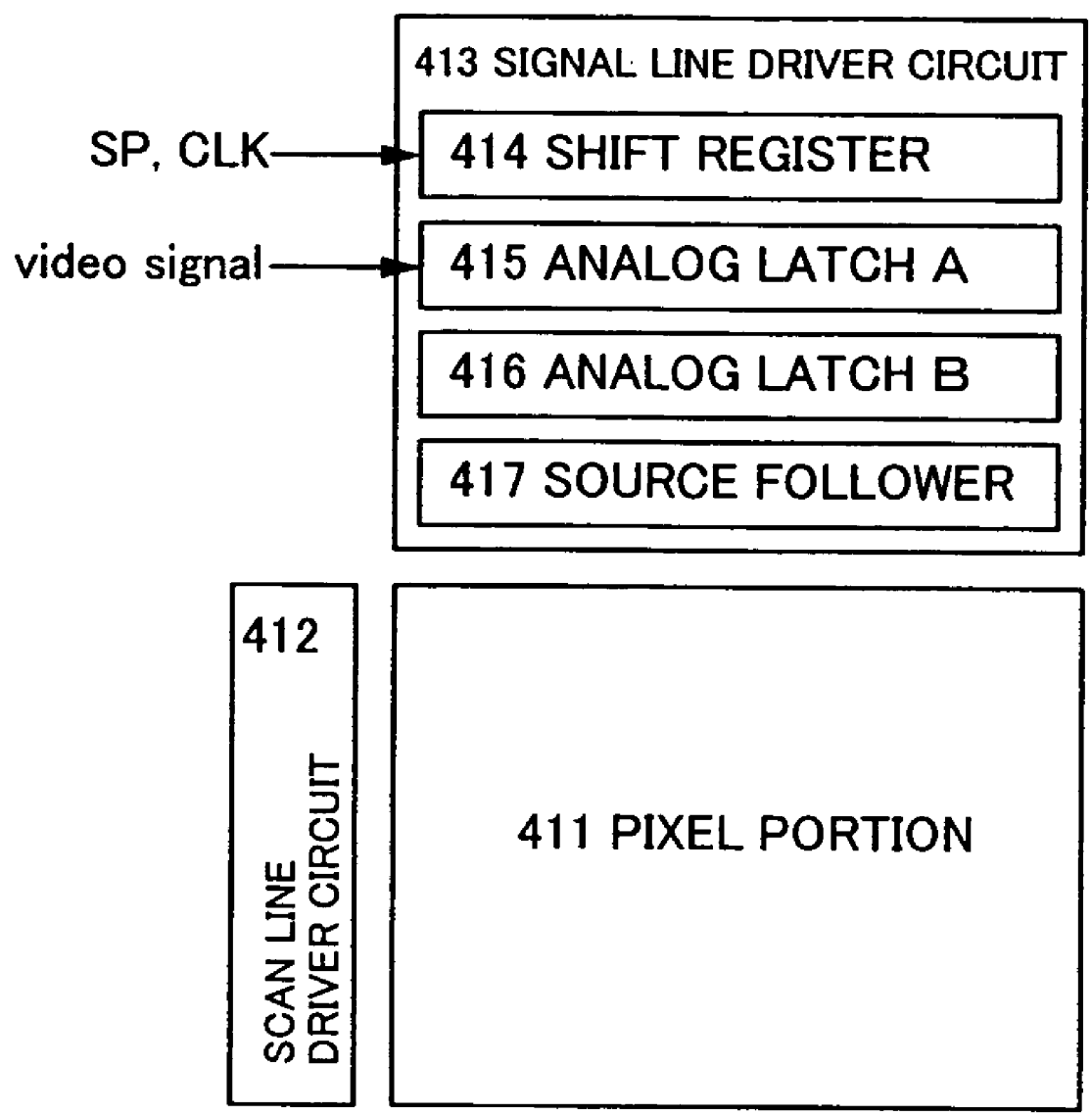
FIG. 4 is a block diagram of the semiconductor device having the circuit having source followers of the invention.

Described in this embodiment is a configuration of a semiconductor device using the driver circuit having source followers of the invention shown in FIG. 2. FIG. 4 is a block diagram of a semiconductor device of this embodiment. The semiconductor device shown in FIG. 4 includes a pixel portion 411 having pixels each having a display element, a scan line driver circuit 412 for selecting each pixel, and a signal line driver circuit 413 for controlling the input of a video signal to the selected pixel. By using the circuit having source followers of the invention in the signal line driver circuit 413 of the semiconductor device in FIG. 4, variations of the source followers can be suppressed, and thus luminance unevenness is prevented from being recognized in the display portion 411.

The signal line driver circuit 413 in FIG. 4 includes a shift register 414, an analog latch A 415, an analog latch B 416 and source followers 417.

The shift register 414 is input with clock signals (CLK) and start pulse signals (SP). When the clock signals (CLK) and the start pulse signals (SP) are input, timing signals are generated in the shift register 414, and then input to the analog latch A 415 as a first step in sequence. In synchronism with the timing signals input to the analog latch A 415, video signals are sequentially written into the analog latch A 415 and stored. It should be noted that although the video signals are sequentially written into the analog latch A 415 in this embodiment, the invention is not limited to this configuration. It is also possible to divide the analog latch A 415 having a plurality of stages into several groups, thereby inputting video signals to each group in parallel, namely performing a division drive. In this case, the number of groups is referred to as the number of division. For example, when dividing the stages of the analog latch A 415 into four groups, the division drive is performed with four divided groups.

A period during which writing of video signals to all the stages of the analog latch A 415 are performed is referred to as a line period. In some cases, a line period in actuality may include the total period of the above line period and a horizontally fly-back period.

When one line period is completed, latch signals (Latch Signals) are supplied to the analog latch B 416 on the second stage. In synchronism with the input of the latch signals, the video signals stored in the analog latch A 415 are all written into the analog latch B 416 all at once and stored. In the analog latch A 415 which has transmitted the video signals to the analog latch B 416, writing of the next video signals are once again started in sequence, in synchronism with the input of the timing signals from the shift register 414. During the second line period, the video signals written to and stored in the analog latch B 416 are input to the source followers 417 as an input potential Vin.

The source followers 417 has the same configuration as FIG. 1. A potential of a video signal stored in a capacitor is supplied to the source followers 417 as the input potential Vin, thus variations in the output potential Vout of the source followers 417 can be suppressed. It should be noted that a switch may be disposed between the source followers 417 and a signal line in order that an output potential is not supplied to the signal line during a writing period and a storing period excluding an output period.

In the case of the semiconductor device having the signal line driver circuit shown in FIG. 4, a display period of a pixel may be overlapped with an output period, and a writing period or a storing period may be provided within a horizontal fry-back period or a vertical fly-back period. In addition, in the period excluding the period for inputting a video signal to a pixel connected to the signal line, a writing period and a storing period can be provided in the period excluding the fly-back period as needed.

It should be noted that an another circuit for selecting a signal line such as a decoder circuit may be employed instead of the shift resistor 414.

EMBODIMENT 2

Figure 5:
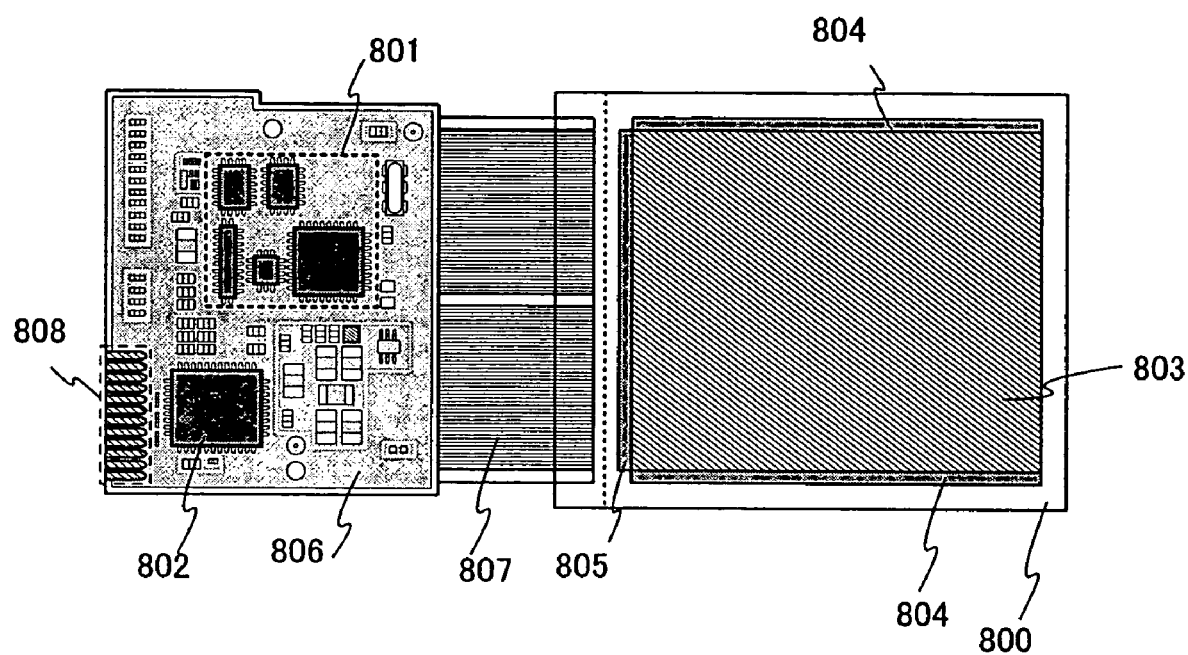
FIG. 5 is an external view of the semiconductor device of the invention.

FIG. 5 is an external view of a light emitting device as one of the semiconductor device having source followers of the invention in the driver circuit. The semiconductor device of the invention may be in various modes that are provable of employing the invention such as an element substrate which corresponds to a mode in which a transistor for controlling a drive of a display element is formed in each pixel but the display element has not been formed yet, a panel which corresponds to a mode in which display elements are formed on the element substrate, or a module which corresponds to a mode in which an IC having a controller, a power supply circuit or the like is mounted on the panel. Described in this embodiment is an example of a specific configuration of a light emitting device which is in a mode of module.

FIG. 5 is an external view of a module in which a controller 801 and a power supply circuit 802 are mounted on a panel 800. The panel 800 includes a pixel portion 803 disposing a light emitting element in each pixel, a scan line driver circuit 804 for selecting the pixel in the pixel portion 803 and a signal line driver circuit 805 for supplying a video signal to the selected pixel. The signal line driver circuit 805 includes the source followers of the invention as in Embodiment 1, therefore, variations among outputs of the source followers can be suppressed, and thus luminance unevenness can be prevented from being recognized.

A printed circuit board 806 includes the controller 801 and the power supply circuit 802. Various signals and power supply voltages output from the controller 801 or the power supply circuit 802 are supplied to the pixel portion 803, the scan line driver circuit 804 and the signal line driver circuit 805 in the panel 800 through an FPC 807. Signals for controlling the source followers and video signals are also supplied to the signal line driver circuit 805 from the controller 801. In addition, power supply voltages and various signals are supplied to a printed circuit board 806 externally through an interface (I/F) portion 808 which has a plurality of input terminals.

It should be noted that although the printed circuit board 806 is mounted on the panel 800 through the FPC in this embodiment, however, the invention is not limited to this structure. The controller 801 and the power supply circuit 802 may be directly mounted on the panel 800 by COG (Chip on Glass) bonding. Alternatively, the controller 801 and the power supply circuit 802 may be integrated in the panel 800. In addition, it is probable in the printed circuit board 806 that a capacitance formed between lead wirings, and resistances of wirings or the like cause noise on a power supply voltage or a signal, or a delay of a rising edge of a signal. In order to prevent these problems, various elements such as a capacitor or a buffer may be provided on the printed circuit board 806.

EMBODIMENT 3

The semiconductor device using the circuit having source followers of the invention can be applied to a variety of electronic apparatuses. Electronic apparatuses using the semiconductor device having the source follower of the invention includes a video camera, a digital camera, a goggle type display (head mounted display), a navigation system, a sound reproducing device (car audio set, component stereo, etc.), a notebook personal computer, a video game machine, a portable information terminal (mobile computer, cellular phone, portable game machine, electronic book, etc.), an image reproducing device provided with a recording medium (more specifically, a device which can reproduce a recording medium such as a digital versatile disc (DVD) and includes a display for displaying the reproduced image), or the like. Specific examples of these electronic apparatuses are shown in FIGS. 6A to 6H.

Figure 6A:
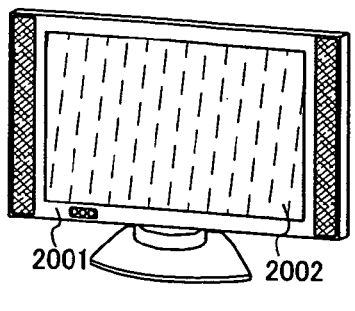
FIGS. 6A to 6H are views of electronic apparatuses using the invention.

FIG. 6A is a display device which includes a housing 2001, a display portion 2002 or the like. The semiconductor device using the circuit having source followers of the invention can be used in the display portion 2002 or the other signal processing circuit. It should be noted that the display device includes all the information display devices such as a personal computer, a TV broadcast receiver or an advertisement display. Therefore, variations in the output of the source followers can be suppressed, and thus luminance unevenness can be prevented from being recognized in the display portion 2002.

Figure 6B:
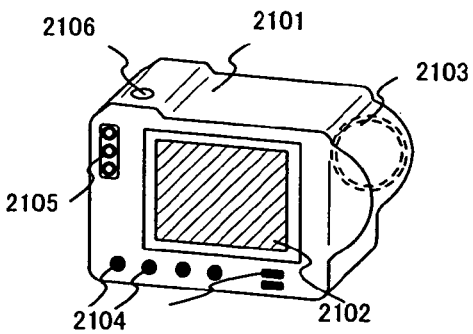

FIG. 6B is a digital still camera which includes a main body 2101, a display portion 2102, an image receiving portion 2103, operating switches 2104, an external connecting port 2105, a shutter 2106 or the like. The semiconductor device using the circuit having source followers of the invention can be used in the display portion 2102 or the other signal processing circuit. Therefore, variations in the output of the source followers can be suppressed, and thus luminance unevenness can be prevented from being recognized in the display portion 2102.

Figure 6C:
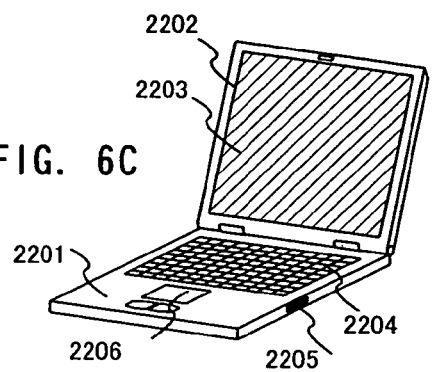

FIG. 6C is a notebook personal computer which includes a main body 2201, a housing 2202, a display portion 2203, a keyboard 2204, an external connecting port 2205, a pointing mouse 2206 or the like. The semiconductor device using the circuit having source followers of the invention can be used in the display portion 2203 or the other signal processing circuit. Therefore, variations in the output of the source followers can be suppressed, and thus luminance unevenness can be prevented from being recognized in the display portion 2203.

Figure 6D:
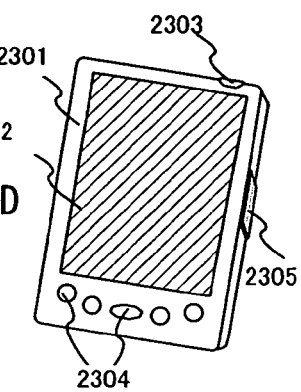

FIG. 6D is a mobile computer which includes a main body 2301, a display portion 2302, a power switch 2303, operating switches 2304, an IR port 2305 or the like. The semiconductor device using the circuit having source followers of the invention can be used in the display portion 2302 or the other signal processing circuit. Therefore, variations in the output of the source followers can be suppressed, and thus luminance unevenness can be prevented from being recognized variations in the display portion 2302.

Figure 6E:
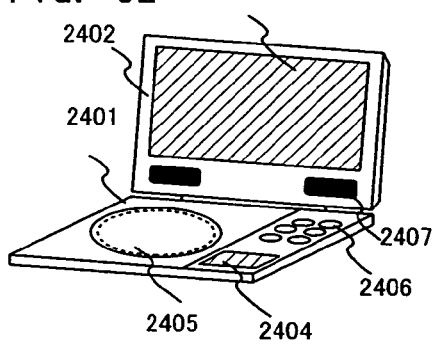

FIG. 6E is a portable image reproducing device provided with a recording medium (specifically, a DVD reproducing device) which includes a main body 2401, a housing 2402, a display portion A2403, a display portion B2404, a recording medium (such as DVD) reading portion 2405, an operating switch 2406, a speaker portion 2407 or the like. The display portion A 2403 mainly displays image data while the display portion B 2404 mainly displays text data. It should be noted that the image reproducing device provided with a recording medium includes a home video game machine or the like. The semiconductor device using the circuit having source followers of the invention can be used in the display portions A 2403 and B 2404, or the other signal processing circuit. Therefore, variations in the output of the source followers can be suppressed, and thus luminance unevenness can be prevented from being recognized in the display portions A 2405 and B 2404.

Figure 6F:
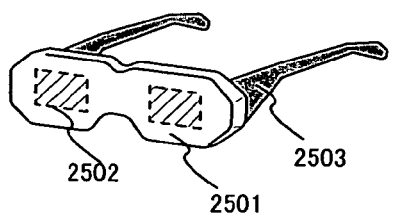

FIG. 6F is a goggle type display (head mounted display) which includes a main body 2501, a display portion 2502, an arm portion 2503 or the like. The semiconductor device using the circuit having source followers of the invention can be used in the display portion 2502 or the other signal processing circuit. Therefore, variations in the output of the source followers can be suppressed, and thus luminance unevenness can be prevented from being recognized in the display portion 2502.

Figure 6G:
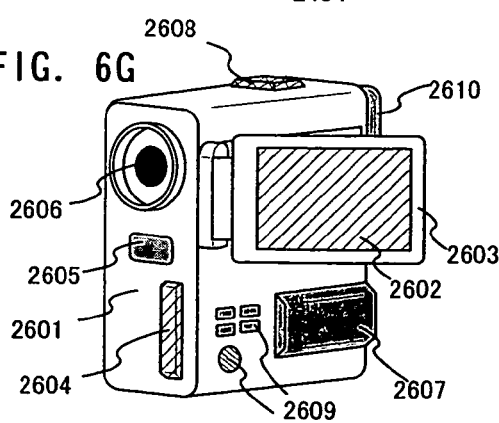

FIG. 6G is a video camera which includes a main body 2601, a display portion 2602, a housing 2603, an external connecting port 2604, a remote control receiving portion 2605, an image receiving portion 2606, a battery 2607, an audio input portion 2608, operating switches 2609 or the like. The semiconductor device using the circuit having source followers of the invention can be used in the display portion 2602 or the other signal processing circuit. Therefore, variations in the output of the source followers can be suppressed, and thus luminance unevenness can be prevented from being recognized in the display portion 2602.

Figure 6H:
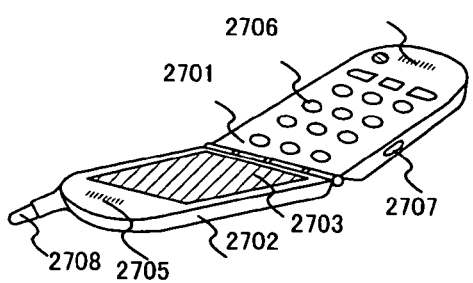
Figure 7:
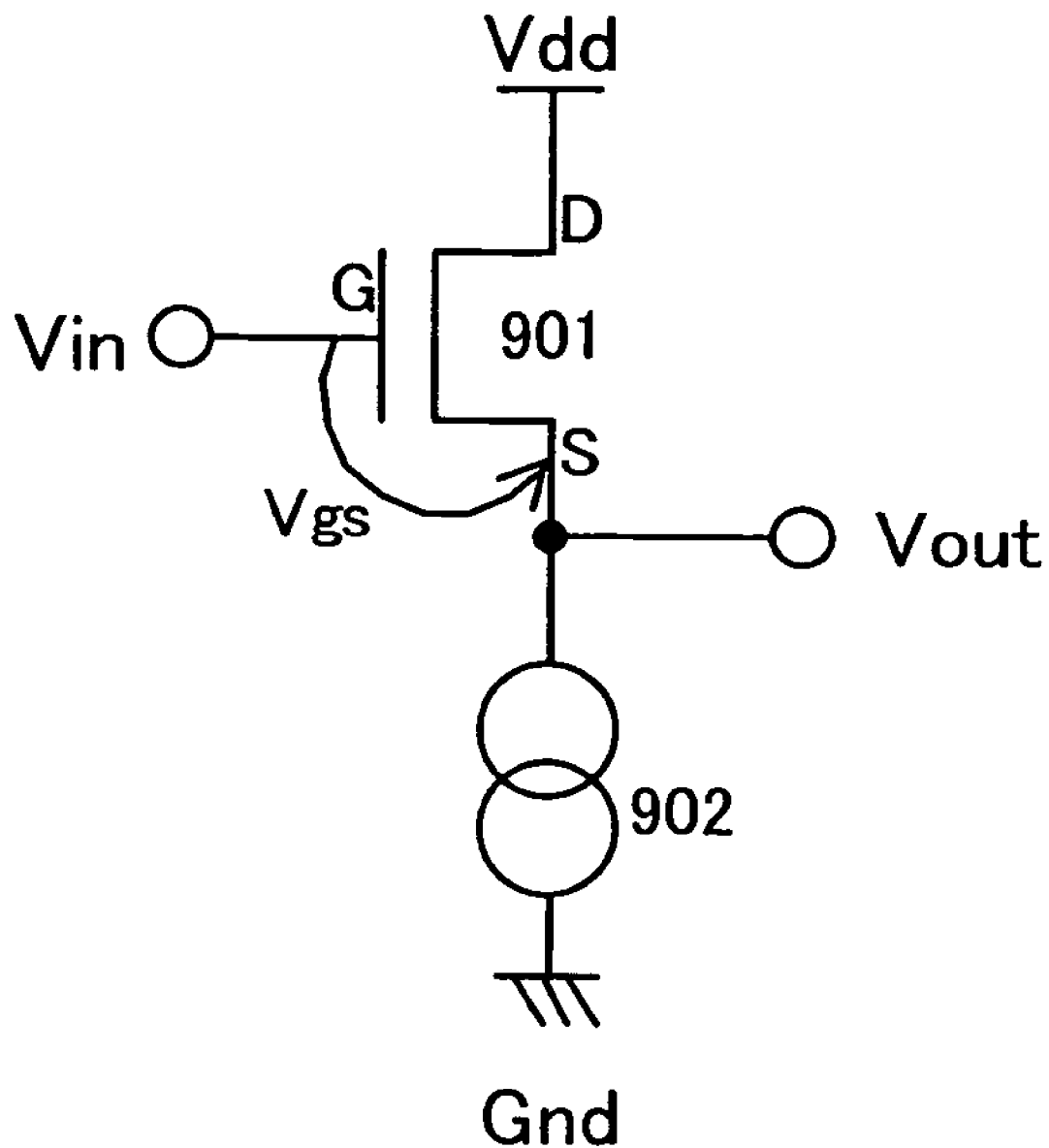
FIG. 7 is a circuit diagram of a general source follower.

FIG. 6H is a cellular phone which includes a main body 2701, a housing 2702, a display portion 2703, an audio input portion 2704, an audio output portion 2705, an operating switch 2706, an external connecting port 2707, an antenna 2708 or the like. By displaying white text on a black background of the display portion 2703, power consumption of the mobile phone can be suppressed. The semiconductor device using the circuit having source followers of the invention can be used in the display portion 2703 or the other signal processing circuit. Therefore, variations in the output of the source followers can be suppressed, and thus luminance unevenness can be prevented from being recognized in the display portion 2703.

As described above, scope of application of the invention is so wide that it can be applied to electronic apparatuses in various fields.

According to the invention, each of power supply lines can be formed narrow in width and a driver circuit can be downsized, achieving a highly integrated semiconductor device with high performance. In addition, according to the semiconductor device having source followers of the invention, variations in the constant current of a transistor as a constant current source can be suppressed, and thus variations in the output of the source followers can be suppressed. Therefore, luminance unevenness can be prevented from being recognized.

This application is based on Japanese Patent Application serial no. 2003-282267 filed in Japan Patent Office on 30, Jul., 2003, the contents of which are hereby incorporated by reference. Although the invention has been fully described by way of Embodiment Modes and Embodiments with reference to the accompanying drawings, it is to be understood that various changes and modifications will be apparent to those skilled in the art. Therefore, unless such changes and modifications depart from the scope of the invention hereinafter defined, they should be constructed as being included therein.

What is claimed is:

1. A circuit comprising:
   a plurality of source followers, each source follower including a first transistor and a second transistor;
   a first power supply line electrically connected to a gate electrode of the second transistor in each source follower;
   a second power supply line electrically connected to a source electrode of the second transistor in each source follower;
   a third power supply line; and
   a plurality of constant current sources, each constant current source disposed between the first power supply line and the third power supply line and electrically connected to the first power supply line and the third power supply line;
   wherein a source electrode of the first transistor is electrically connected to a drain electrode of the second transistor;
   wherein an output potential of each source follower is corrected by correcting a potential of the first power supply line by the constant current source and the third power supply line.

2. A circuit according to claim 1, wherein each of the first transistor and the second transistor is a thin film transistor.

3. A circuit according to claim 1, wherein the first transistor and the second transistor have the same conductivity.

4. A circuit according to claim 1, wherein the number of the constant current sources disposed between the first power supply line and the third power supply line is equal to that of the source followers.

5. A semiconductor device comprising: a pixel portion; a signal line driver circuit; and a scan line driver circuit in a display portion, wherein the signal line driver circuit includes a circuit according to claim 1.

6. A circuit comprising:
   a plurality of source followers, each source follower including a first transistor and a second transistor;
   a first power supply line electrically connected to a gate electrode of the second transistor in each source follower;
   a second power supply line electrically connected to a source electrode of the second transistor in each source follower;
   a third power supply line; and
   a plurality of resistors, each resistor disposed between the first power supply line and the third power supply line and electrically connected to the first power supply line and the third power supply line;
   wherein a source electrode of the first transistor is electrically connected to a drain electrode of the second transistor;
   wherein an output potential of each source follower is corrected by correcting a potential of the first power supply line by the resistor and the third power supply line.

7. A circuit according to claim 6, wherein each of the first transistor and the second transistor is a thin film transistor.

8. A circuit according to claim 6, wherein the first transistor and the second transistor have the same conductivity.

9. A circuit according to claim 6, wherein the number of resistors disposed between the first power supply line and the third power supply line is equal to that of the source followers.

10. A semiconductor device comprising: a pixel portion; a signal line driver circuit; and a scan line driver circuit in a display portion, wherein the signal line driver circuit includes a circuit according to claim 6.

11. A circuit comprising:
a plurality of source followers, each source follower including a first transistor and a second transistor;
a first power supply line electrically connected to a gate electrode of the second transistor in each source follower;
a second power supply line electrically connected to a source electrode of the second transistor in each source follower;
a third power supply line; and
a plurality of constant current sources, each constant current source disposed between the first power supply line and the third power supply line and electrically connected to the first power supply line and the third power supply line;
wherein a source electrode of the first transistor is electrically connected to a drain electrode of the second transistor.

12. A circuit according to claim 11, wherein each of the first transistor and the second transistor is a thin film transistor.

13. A circuit according to claim 11, wherein the first transistor and the second transistor have the same conductivity.

14. A circuit according to claim 11, wherein the number of the constant current sources disposed between the first power supply line and the third power supply line is equal to that of the source followers.

15. A circuit according to claim 11, wherein an output potential of each source follower is corrected by correcting a potential of the first power supply line by the constant current source and the third power supply line.

16. A circuit comprising:
a plurality of source followers, each source follower including a first transistor and a second transistor;
a first power supply line electrically connected to a gate electrode of the second transistor in each source follower;
a second power supply line electrically connected to a source electrode of the second transistor in each source follower;
a third power supply line; and
a plurality of resistors, each resistor disposed between the first power supply line and the third power supply line and electrically connected to the first power supply line and the third power supply line;
wherein a source electrode of the first transistor is electrically connected to a drain electrode of the second transistor.

17. A circuit according to claim 16, wherein each of the first transistor and the second transistor is a thin film transistor.

18. A circuit according to claim 16, wherein the first transistor and the second transistor have the same conductivity.

19. A circuit according to claim 16, wherein the number of resistors disposed between the first power supply line and the third power supply line is equal to that of the source followers.

20. A circuit according to claim 16, wherein an output potential of each source follower is corrected by correcting a potential of the first power supply line by the resistor and the third power supply line.

21. A display device comprising:
a pixel portion;
a signal line driver circuit; and
a scan line driver circuit;
wherein the signal line driver circuit includes a circuit comprising:
a plurality of source followers, each source follower including a first transistor and a second transistor;
a first power supply line electrically connected to a gate electrode of the second transistor in each source follower;
a second power supply line electrically connected to a source electrode of the second transistor in each source follower;
a third power supply line; and
a plurality of constant current sources, each constant current source disposed between the first power supply line and the third power supply line and electrically connected to the first power supply line and the third power supply line;
wherein a source electrode of the first transistor is electrically connected to a drain electrode of the second transistor.

22. A device according to claim 21, wherein each of the first transistor and the second transistor is a thin film transistor.

23. A device according to claim 21, wherein the first transistor and the second transistor have the same conductivity.

24. A device according to claim 21, wherein the number of the constant current sources disposed between the first power supply line and the third power supply line is equal to that of the source followers.

25. A device according to claim 21, wherein an output potential of each source follower is corrected by correcting a potential of the first power supply line by the constant current source and the third power supply line.

26. A camera comprising a display device according to claim 21.

27. A personal computer comprising a display device according to claim 21.

28. A portable information terminal comprising a display device according to claim 21.

29. A display device comprising:
a pixel portion;
a signal line driver circuit; and
a scan line driver circuit;
wherein the signal line driver circuit includes a circuit comprising:
a plurality of source followers, each source follower including a first transistor and a second transistor;
a first power supply line electrically connected to a gate electrode of the second transistor in each source follower;
a second power supply line electrically connected to a source electrode of the second transistor in each source follower;
a third power supply line; and
a plurality of resistors, each resistor disposed between the first power supply line and the third power supply line and electrically connected to the first power supply line and the third power supply line;

wherein a source electrode of the first transistor is electrically connected to a drain electrode of the second transistor.

30. A device according to claim 29, wherein each of the first transistor and the second transistor is a thin film transistor.

31. A device according to claim 29, wherein the first transistor and the second transistor have the same conductivity.

32. A device according to claim 29, wherein the number of resistors disposed between the first power supply line and the third power supply line is equal to that of the source followers.

33. A device according to claim 29, wherein an output potential of each source follower is corrected by correcting a potential of the first power supply line by the resistor and the third power supply line.

34. A camera comprising a display device according to claim 29.

35. A personal computer comprising a display device according to claim 29.

36. A portable information terminal comprising a display device according to claim 29.

* * * * *